(12) United States Patent
Fan et al.

(10) Patent No.: US 7,875,473 B2
(45) Date of Patent: Jan. 25, 2011

(54) METHOD OF MANUFACTURING LIGHT EMITTING DIODE DEVICE

(75) Inventors: Ben Fan, He Shan (CN); Hsin-Chuan Weng, He Shan (CN); Kuo-Kuang Yeh, He Shan (CN)

(73) Assignee: He Shan Lide Electronic Enterprise Company Ltd., He Shan, Guangdong (CN)

( * ) Notice: Subject to any disclaimer, the term of this patent is extended or adjusted under 35 U.S.C. 154(b) by 0 days.

(21) Appl. No.: 12/776,367

(22) Filed: May 7, 2010

(65) Prior Publication Data

US 2010/0216265 A1 Aug. 26, 2010

Related U.S. Application Data

(62) Division of application No. 12/351,668, filed on Jan. 9, 2009.

(30) Foreign Application Priority Data

Feb. 25, 2008 (CN) .......................... 2008 1 0026479

(51) Int. Cl.
*H01L 21/00* (2006.01)

(52) U.S. Cl. .............................. 438/27; 438/29; 438/33; 438/108; 257/E33.001

(58) Field of Classification Search .................. 438/27, 438/29, 33, 108; 257/E33.001
See application file for complete search history.

(56) References Cited

U.S. PATENT DOCUMENTS 7,195,944 B2 * 3/2007 Tran et al. ..................... 438/46

* cited by examiner

*Primary Examiner*—Jack Chen
(74) *Attorney, Agent, or Firm*—patenttm.us

(57) ABSTRACT

A method of manufacturing light-emitting diode device has steps of isolating a light-emitting side of an LED chip from a wire-bonding region by disposing partition panels on the wire-bonding region and coating phosphors on the light-emitting side of the LED chip in a phosphor-coating process. The method can be applied to manufacturing LED device having a flip chip structure or a vertical chip structure. According to the method, a white LED device can be directly manufactured without adopting a phosphor package technique, and thereby a whole package process of the white LED device is simplified.

4 Claims, 4 Drawing Sheets

METHOD OF MANUFACTURING LIGHT EMITTING DIODE DEVICE

BACKGROUND OF THE INVENTION

1. Field of the Invention

The present invention relates to a light emitting diode, especially to a method of manufacturing light emitting diode device that isolates a light-emitting side from other regions of the semi-manufactured LED device, such as a wire-bonding region, for coating phosphors on the light-emitting side alone.

2. Description of the Related Art

Light-emitting diodes (LED) are forward-biased P-N junction diodes made of semiconductor materials. When terminals of the PN junction diodes are biased in a forward direction, the recombination of non-equilibrium carriers (electron-hole pairs) causes an emission of light. Foregoing light-emitting process primarily corresponds to a spontaneous light-emitting process. Materials for manufacturing the LED are heavily doped and therefore form a PN junction wherein an n-type region has an excess of free electrons and a p-type region an excess of holes under a thermal equilibrium condition. A depletion region forms spontaneously across a P-N junction and prevents electrons and holes from recombining. When the p-n junction is forward-biased with a sufficient voltage, the depletion region will be narrowed and electrons can overcome a resistivity of the depletion region to cross the PN junction and inject into a side of the PN junction near the p-type region. Electrons then meet and recombine with holes and the recombination thereby results in light emission.

Generally, a conventional light-emitting diode (LED) is manufactured by forming a laminated structure mounted on a substrate wherein the laminated structure comprises an n-type semiconductor layer, a light-emitting layer and a p-type semiconductor layer. The conventional LED may adopt different materials and structures to meet different desired wavelengths of emitted lights. For example, blue and green LEDs usually use sapphire as a substrate and GaInN epitaxial structure as a laminated structure. Because the sapphire is used as the substrate, an anode and a cathode of the conventional light-emitting diode are formed at the same side of the substrate. As reference to FIG. 1, an n-type GaN layer (5), a light-emitting layer (4), a p-type GaN layer (3) and a transparent electrode layer (2) are sequentially formed on a sapphire substrate (6). An anode (1) and a cathode (7) are respectively formed on the transparent electrode layer (2) and the n-type GaN layer (5). However, the sapphire substrate (6) is weak at heat dissipating and a heat-conductive structure is disposed at a distance from the light-emitting layer (4). Therefore the conventional LEDs are limited to be manufactured into small-area ones with low power, such as one LED having an area of 0.3 mm×0.3 mm with an operating current at 20 mA.

With the requirements of a higher lighting efficiency and better illumination, a conventional LED device having a flip chip structure gradually replaces foregoing conventional LED device as a high power LED device. With reference to FIG. 2, a back side of a flip-chip (8) functions as a light-emitting side, and electrodes at a front side of the flip-chip (8) is attached to a heat-sink side of a silicon substrate (9) wherein the silicon substrate (9) functions as a heat-conductive structure. Since the flip-chip (8) are close to the silicon substrate (9), a heat-dissipating efficiency is enhanced. Therefore, area of an LED device can be increased to 1 mm×1 mm, operating current can be achieved to 300 or 500 mA and then the LED device can be provided with a power up to 1 Watt.

High power LED devices are mainly applied to white light illumination. A technique of manufacturing white LED devices usually requires a package technique of packaging phosphors. However, during a process of manufacturing white LED devices, phosphor coating is hard to control and uneven white light illumination may occur to influence color temperature and coordinate of emitted white lights, and thereby lead to a package yield decrease. Such package defect is particularly obvious to a high power white LED device.

To overcome the shortcomings, the present invention provides a method of manufacturing light-emitting diode device to mitigate or obviate the aforementioned problems.

SUMMARY OF THE INVENTION

The main objective of the invention is to provide a method of manufacturing light-emitting diode (LED) device. The method in accordance with the present invention comprises steps of:

isolating an light-emitting side of an LED chip from a wire-bonding region by disposing partition panels on the wire-bonding region; and coating phosphors on the light-emitting side of the LED chip during a phosphor-coating process.

Preferably, the LED device is a high-power white LED device.

Preferably, the LED device has a flip-chip structure or a vertical chip structure.

Another objective of the invention is to provide a method of manufacturing light-emitting diode device having a flip-chip structure. The method in accordance with the present invention comprises steps of:

mounting at least one flip-chip structure on a top of a base wherein a wire-bonding region is disposed on the top of the base and surrounding the at least one flip-chip structure, each of the at least one flip-chip structure comprising
  a transparent substrate having a back surface; and
  a transparent electrode layer being as a light-emitting side of the flip chip structure and being mounted on the back surface of the transparent substrate;

isolating the transparent electrode layer from the wire-bonding region by disposing a partition panel on the wire-bonding region;

coating a slurry of phosphors on the transparent electrode layer;

evaporating solvents of the slurry by heating to solidify the phosphors and thereby form a phosphor layer;

removing the partition panel; and cutting the base into sections to form at least one single-unit LED devices having a flip-chip structure.

Preferably, a roughened layer having a rough surface is disposed between the transparent electrode layer and the phosphor layer.

Preferably, the LED device is a high-power white LED device.

Another objective of the invention is to provide a method of manufacturing light-emitting diode device having a flip chip structure. The method in accordance with the present invention comprises steps of:

mounting at least one flip chip structure on a top of a base wherein a metal joint layer is disposed between the at least one flip-chip structure and the top of the base, and a periphery part of the metal joint layer surrounds the at least one flip-chip structure, each of the at least one flip-chip structure comprising
  a reflective metal layer being opposite to the metal joint layer; and a n-type semiconductor layer being as a light-emitting side;

disposing a partition panel on the periphery part of the metal joint layer to isolate the n-type semiconductor layer from the periphery part of the metal joint layer;

coating a slurry of phosphors on the n-type semiconductor layer;

evaporating solvents of the slurry by heating to solidify the phosphors and thereby form a phosphor layer;

removing the partition panel; and cutting the base into sections to form at least one single-unit LED device having a flip-chip structure.

Preferably, a roughened layer having a rough surface is disposed between the n-type semiconductor layer and the phosphor layer.

Preferably, the LED device is a high-power white LED device.

The other objective of the invention is to provide a method of manufacturing light-emitting diode device having a vertical chip structure. The method in accordance with the present invention comprises steps of:

mounting at least one vertical chip structure on a top of a base and each of the at least one vertical chip structure comprising a p side electrode, a p-type semiconductor layer, a light-emitting layer, a n-type semiconductor layer and a transparent electrode layer being sequentially disposed on the base, wherein the transparent electrode layer functions as a light-emitting side and a wire-bonding region is disposed on a part of the transparent electrode layer;

disposing a partition panel on the wire-bonding region to isolate the wire-bonding region from the rest of the transparent electrode layer;

coating a slurry of phosphors on the transparent electrode layer;

evaporating solvents of the slurry by heating to solidify the phosphors to form a phosphor layer;

removing the partition panel; and cutting the base into sections to form at least one single-unit LED device having a vertical chip structure.

Preferably, a roughened layer having a rough surface is disposed between the transparent electrode layer and the phosphor layer.

Preferably, the LED device is a high-power white LED device.

The method of the present invention uses partition panels to isolate the light-emitting side from other regions, such as the wire-bonding region or the metal joint layer, for coating phosphors on the light-emitting side alone. Therefore, the white LED device can be directly manufactured without using a phosphor package technique, and thereby the whole manufacturing process of white LED device is simplified.

Other objectives, advantages and novel features of the invention will become more apparent from the following detailed description when taken in conjunction with the accompanying drawings.

DETAILED DESCRIPTION OF THE PREFERRED EMBODIMENTS

According to the present invention, using a partition panel to isolate a light-emitting side of a light-emitting diode (LED) device from other regions like a wire-bonding region and coating phosphors alone on the light-emitting side during a phosphor-coating process can improve uniformity of the phosphor coating and omit a phosphor package technique of a package process. The present invention can be applied in manufacturing LED device having a flip chip structure or a vertical chip structure.

Figure 1:
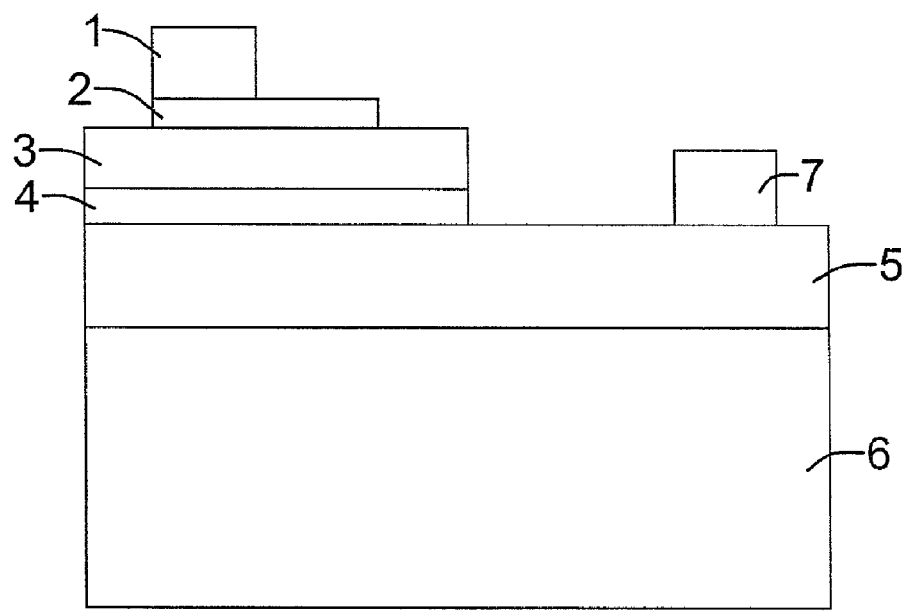
FIG. 1 is a schematic cross sectional side view of a conventional blue and green light-emitting diode in accordance with the prior art.
Figure 2:
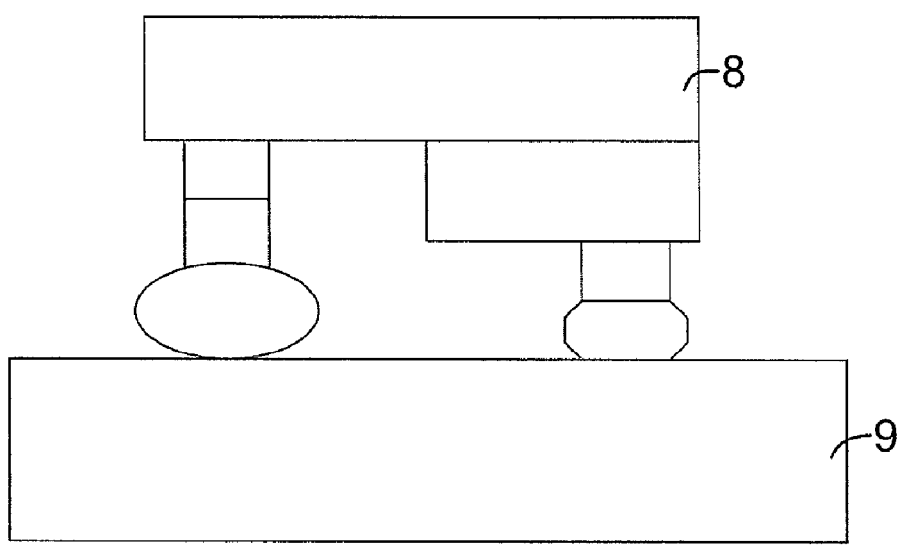
FIG. 2 is a schematic cross sectional side view of a conventional light-emitting diode device adopting a flip-chip structure in accordance with the prior art.
Figure 3:
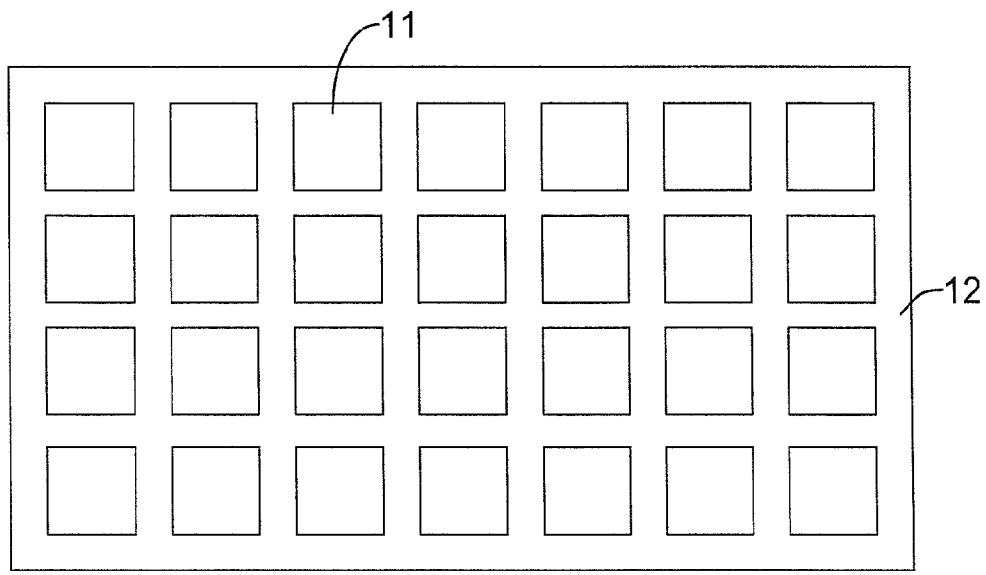
FIG. 3 is a schematic plane view of a partition panel that is used when applying a first embodiment of a method in accordance with the present invention to manufacture a light-emitting diode device having a flip chip structure.
Figure 4:
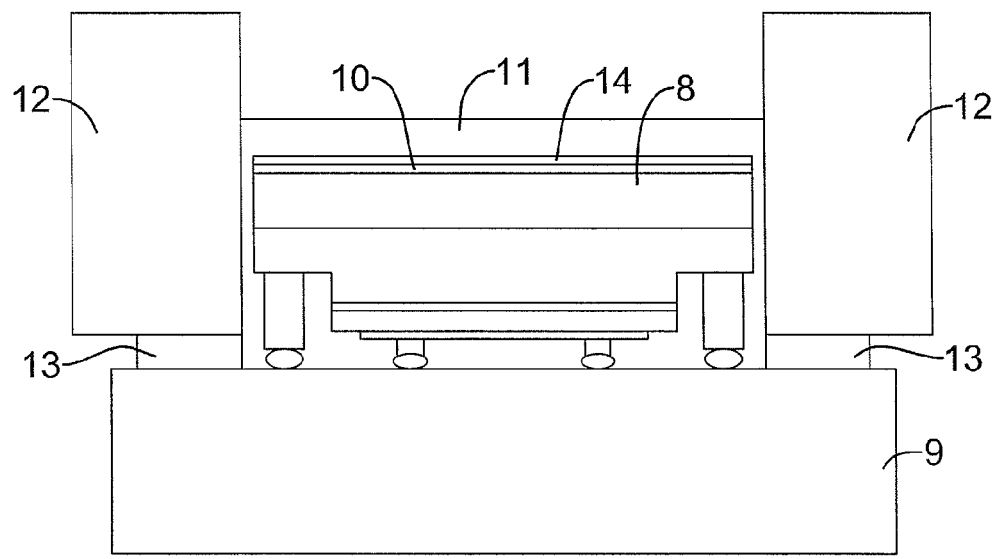
FIG. 4 is a schematic cross sectional side view of manufacturing the light-emitting diode device having a flip chip structure with the partition panel shown in FIG. 3 by the first embodiment of the method.

FIG. 3 is a schematic plane view of a partition panel that is used when applying a first embodiment of a method in accordance with the present invention to manufacture a light-emitting diode device having a flip chip structure. FIG. 4 is a schematic cross sectional side view of manufacturing the light-emitting diode device having a flip chip structure with the partition panel shown in FIG. 3 by the first embodiment of the method.

With reference to FIG. 4, at least one flip chip structure having a transparent substrate (8) is mounted on a top of a base (9) with a topside of the at least one flip chip structure facing the base (9). The base (9) may be composed of materials selected from the group consisting of silicon, aluminum nitride, copper, gallium nitride, zinc oxide and combinations. The transparent substrate (8) is mounted on a backside of the flip chip structure and may be made of sapphire. A transparent electrode layer (10) functioning as a light-emitting side of the at least one flip chip structure is disposed on a back surface of the transparent substrate (8).

A roughened layer (14) having a rough surface may be selectively disposed on the transparent electrode layer (10) to enhance adhesion of phosphors when coating the phosphors to the at least one flip chip structure.

A wire-bonding region (13) is disposed on the top of the base (9) and surrounds the flip chip structure. A partition panel (12) is disposed on the wire-bonding region (13) to isolate the transparent electrode layer (10) functioning as a light-emitting side from the wire-bonding region (13). FIG. 3 shows a plane view of a partition panel (12) being applied in multiple flip chip structures. The partition panel (12) has multiple openings being respectively aligned to the multiple flip chip structures. Each opening has a gauge corresponding to a size of each flip chip structure.

Slurry of phosphors is directly coated on the transparent electrode layer (10) and may be on the roughened layer (14) by spin coating or instillation coating. Evaporating solvents of the slurry by heating solidifies the phosphors and thereby forms a phosphor layer (11). Through foregoing step, the phosphors can be evenly coated and solidified on the light-emitting side of the flip chip structure. Therefore adopting a phosphor package technique during a package process can be avoided. After forming the phosphor layer (11), the partition panel (12) will be removed and then the base (9) will be cut into sections to form at least one single-unit LED device having a flip chip structure.

Therefore, the first embodiment of the method in accordance with the present invention comprises steps of:

mounting at least one flip chip structure on a top of a base wherein each of the at least one flip chip structure comprising a transparent substrate and a transparent electrode layer being mounted on a back surface of the transparent substrate;

disposing a partition panel on a wire-bonding region being surrounding the flip chip structure;

coating a slurry of phosphors on the transparent electrode layer;

evaporating solvents of the slurry by heating to solidify the phosphors to form a phosphor layer;

removing the partition panel; and cutting the base into sections to form at least one single-unit LED device having a flip chip structure.

Figure 5:
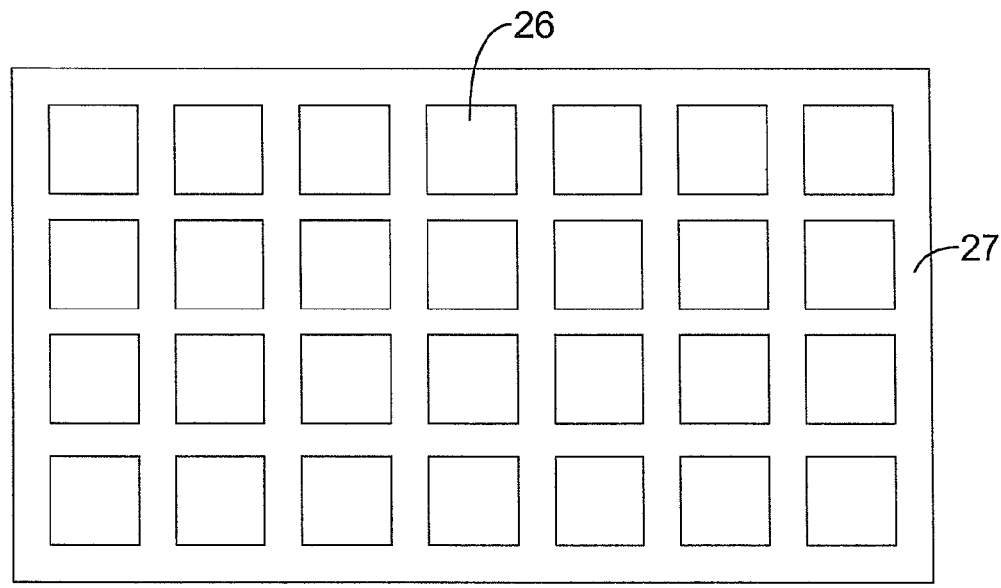
FIG. 5 is a schematic plane view of a partition panel that is used when applying a second embodiment of the method in accordance with the present invention to manufacture a light-emitting diode device having another flip chip structure.
Figure 6:
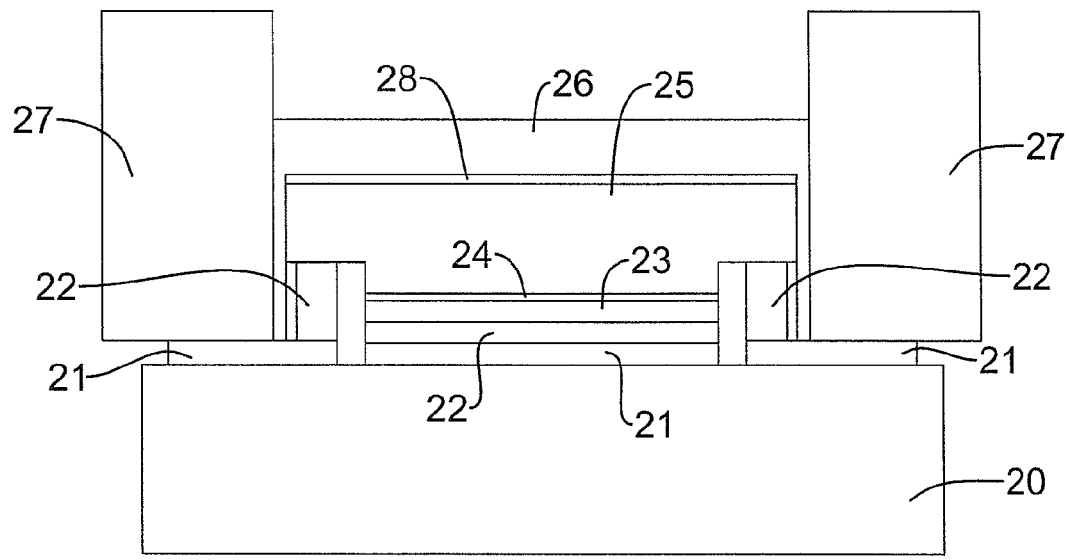
FIG. 6 is a schematic cross sectional side view of manufacturing the light-emitting diode device having the another flip chip structure with the partition panel shown in FIG. 5 by the second embodiment of the method in accordance with the present invention.

FIG. 5 is a schematic plane view of a partition panel that is used when applying a second embodiment of the method in accordance with the present invention to manufacture a light-emitting diode device having another flip chip structure. FIG. 6 is a schematic cross sectional side view of manufacturing the light-emitting diode device having the another flip chip structure with the partition panel shown in FIG. 5 by the second embodiment of the method in accordance with the present invention.

With reference to FIG. 6, at least one flip chip structure is mounted on a top of a base (20) through a metal joint layer (21). The base (20) may be composed of materials selected from the group consisting of silicon, aluminum nitride, copper, gallium nitride, zinc oxide and combinations. A periphery part of the metal joint layer (22) surrounds the at least one flip chip structure. The at least one flip chip structure comprises a reflective metal layer (22) being opposite to the metal joint layer (21) and a light-emitting laminated structure. The light-emitting structure comprises a p-type semiconductor layer (23), a quantum-well emission layer (24) and an n-type semiconductor layer (25) being sequentially disposed on the reflective metal layer (22). The p-type semiconductor layer (23) may be implemented as p-type gallium nitride. The n-type semiconductor layer (25) may be implemented as n-type gallium nitride.

The flip chip structure in FIG. 6 differs from the flip chip structure in FIG. 4 by having the transparent substrate removed. A roughened layer (28) having a rough surface may be selectively disposed on the n-type semiconductor layer (25) to enhance adhesion of phosphors when coating the phosphors to the at least one flip chip structure.

A partition panel (27) is disposed on the periphery part of the metal joint layer (22) to isolate the n-type semiconductor layer (25) functioning as a light-emitting side from the periphery part of the metal joint layer (22). The partition panel (27) has multiple openings being respectively aligned to the at least one flip chip structure. Each opening has a gauge corresponding to a plane size of the n-type semiconductor layer (25). Slurry of phosphors is directly coating on the n-type semiconductor layer (25) and may be on the roughened layer (28) by spin coating or instillation coating. Evaporating solvents of the slurry by heating solidifies the phosphors and thereby forms a phosphor layer (26). After forming the phosphor layer (26), the partition panel (27) will be removed and then the base (20) will be cut into sections to form at least one single-unit LED device having a flip chip structure.

Through foregoing step, the phosphors can be evenly coated and solidified on the light-emitting side of the flip chip structure. Therefore adopting a phosphor package technique during a package process can be avoided.

Hence, the second embodiment of the method in accordance with the present invention comprises steps of:

mounting at least one flip chip structure on a top of a base through a metal joint layer wherein each of the at least one flip chip structure comprising a reflective metal layer being opposite to the metal joint layer and a n-type semiconductor layer being disposed on the reflective metal layer;

disposing a partition panel on a periphery part of the metal joint layer to isolate the n-type semiconductor layer from the periphery part of the metal joint layer;

coating a slurry of phosphors on the n-type semiconductor layer;

evaporating solvents of the slurry by heating to solidify the phosphors to form a phosphor layer;

removing the partition panel; and cutting the base into sections to form at least one single-unit LED device having a flip chip structure.

Figure 7:
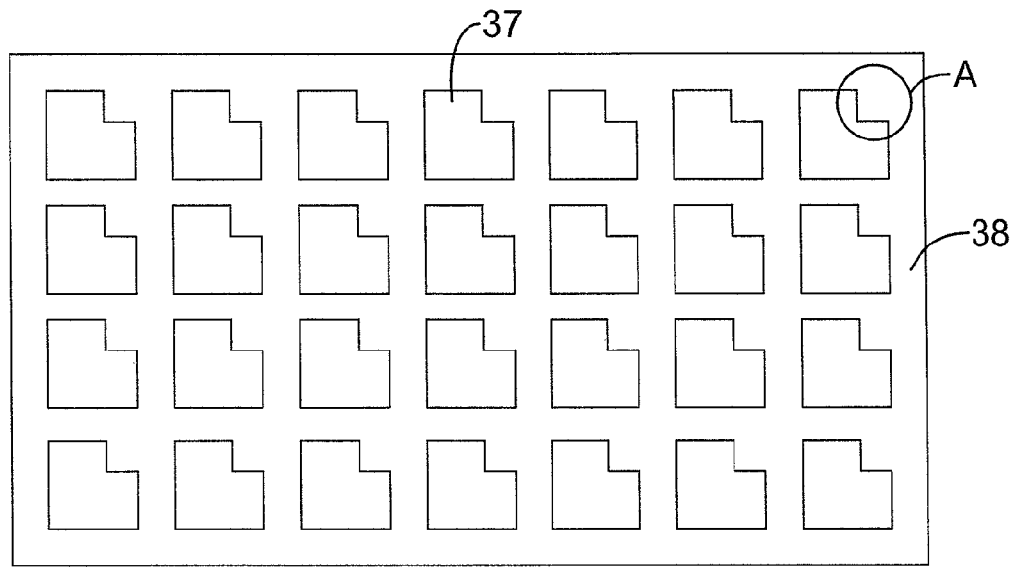
FIG. 7 is a schematic cross sectional side view of a partition panel that is used when applying a third embodiment of the method in accordance with the present invention to manufacture a light-emitting diode device having a vertical chip structure.
Figure 8:
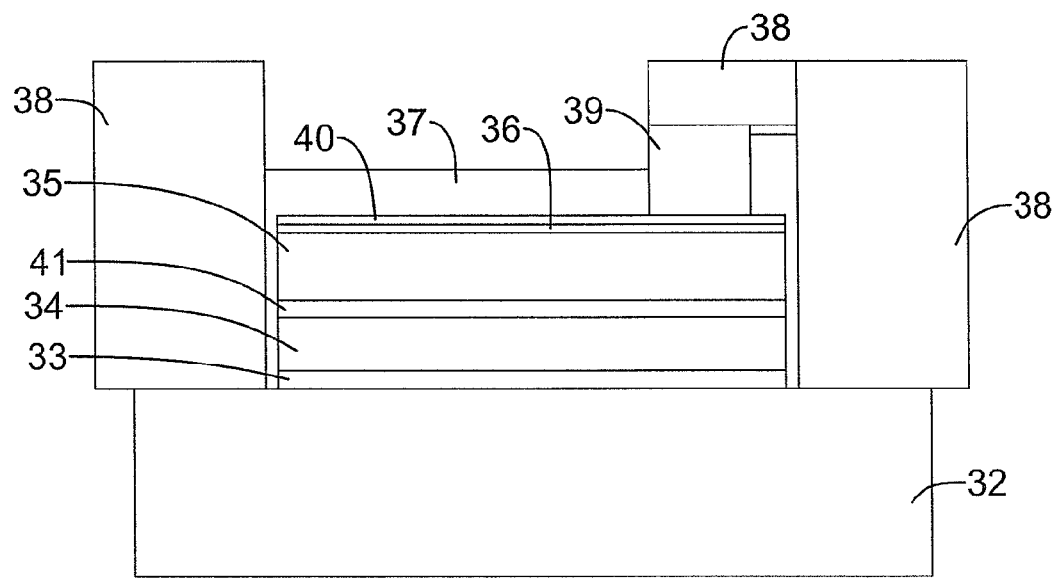
FIG. 8 is a schematic cross sectional side view of manufacturing the light-emitting diode device having a vertical chip structure with the partition panel shown in FIG. 7 by the third embodiment of the method in accordance with the present invention.

FIG. 7 is a schematic cross sectional side view of a partition panel that is used when applying a third embodiment of the method in accordance with the present invention to manufacture a light-emitting diode device having a vertical chip structure. FIG. 8 is a schematic cross sectional side view of manufacturing the light-emitting diode device having a vertical chip structure with the partition panel shown in FIG. 7 by the third embodiment of the method in accordance with the present invention.

With reference to FIG. 8, at least one vertical chip structure comprises a p side electrode (33), a p-type semiconductor layer (34), a light-emitting layer (41), a n-type semiconductor layer (35) and a transparent electrode layer (36) being disposed on a base (32) in sequence. The transparent electrode layer (36) functions as a light-emitting side of the vertical structure. A roughened layer (40) having a rough surface may be selectively disposed on the transparent electrode layer (36) to enhance adhesion of phosphors when coating the phosphors to the at least one vertical chip structure. A wire-bonding region (39) is disposed on a part of the transparent electrode layer (36) and may be on a part of the rough surface of the roughened layer (40).

FIG. 7 shows a plane view of a partition panel (38) being applied in multiple vertical chip structures mounted on the base (32). The partition panel (38) differs from the partition panel (12, 27) by having extensions (A) for respectively covering each wire-bonding region (39) to isolate each wire-bonding region (39) from the rest of the transparent electrode layer (36). The partition panel (38) has multiple openings being respectively aligned to the multiple vertical chip structures. Each opening corresponds in shape and in size to the light-emitting side of each flip chip structure.

Slurry of phosphors is directly coating on the light-emitting side by spin coating or instillation coating. Evaporating solvents of the slurry by heating solidifies the phosphors and thereby forms a phosphor layer (37). After forming the phosphor layer (37), the partition panel (38) will be removed and then the base (32) will be cut into sections to form at least one single-unit LED device having a vertical chip structure. Through foregoing step, the phosphors can be evenly coated and solidified on the light-emitting side of the vertical chip structure. Therefore adopting a phosphor package technique during a package process can be avoided.

Hence, the third embodiment of the method in accordance with the present invention comprises steps of:

mounting at least one vertical chip structure on a top of a base and each of the at least one vertical chip structure comprising a p side electrode, a p-type semiconductor layer, a light-emitting layer, a n-type semiconductor layer and a transparent electrode layer being sequentially disposed on the base, wherein a wire-bonding region is disposed on a part of the transparent electrode layer;

disposing a partition panel on the wire-bonding region to isolate the wire-bonding region from the rest of the transparent electrode layer;

coating a slurry of phosphors on the transparent electrode layer;

evaporating solvents of the slurry by heating to solidify the phosphors to form a phosphor layer;

removing the partition panel; and cutting the base into sections to form at least one single-unit LED device having a vertical chip structure.

The present invention can also be applied in other LED device having other kind of chip structure, especially can be applied in high power LED device having a phosphor layer.

According to the present invention, using a partition panel to isolate a light-emitting side of a light-emitting diode (LED) device from other regions like a wire-bonding region and thereby coating phosphors alone on the light-emitting side during a phosphor-coating process can improve uniformity of the phosphors. For a white LED device, uniformity of color temperature and coordinate of white lights can be effectively controlled. Therefore, the white LED devices can be directly manufactured without adopting a phosphor package technique, and thereby a package process of the white LED device is simplified.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method of manufacturing light-emitting diode (LED) device having a flip-chip structure comprising steps of:

mounting at least one flip-chip structure on a top of a base wherein a wire-bonding region is disposed on the top of the base and surrounding the at least one flip-chip structure, each of the at least one flip chip structure comprising
a transparent substrate having a back surface; and
a transparent electrode layer being as a light-emitting side of the flip chip structure and being mounted on the back surface of the transparent substrate;

isolating the transparent electrode layer from the wire-bonding region by disposing a partition panel on the wire-bonding region;

coating a slurry of phosphors on the transparent electrode layer;

evaporating solvents of the slurry by heating to solidify the phosphors and thereby form a phosphor layer;

removing the partition panel; and cutting the base into sections to form at least one single-unit LED devices having a flip-chip structure.

2. The method as claimed in claim 1, wherein a roughened layer having a rough surface is disposed between the transparent electrode layer and the phosphor layer.

3. The method as claimed in claim 1, wherein the LED device is a high-power white LED device.

4. The method as claimed in claim 2, wherein the LED device is a high-power white LED device.

* * * * *